United States Patent [19]

Richards, Jr.

[11] Patent Number: 4,856,084

[45] Date of Patent: Aug. 8, 1989

[54] NOISE BLANKING SYSTEM FOR AN AM RADIO RECEIVER

[75] Inventor: Oliver L. Richards, Jr., Windham, Conn.

[73] Assignee: Sprague Electric Company, North Adams, Mass.

[21] Appl. No.: 156,049

[22] Filed: Feb. 16, 1988

[51] Int. Cl.[4] .............................................. H04B 7/00
[52] U.S. Cl. ..................................... 455/223; 455/311
[58] Field of Search ............... 455/221, 311, 223, 219, 455/225, 220, 222, 224, 303, 341; 375/104; 328/165

[56] References Cited

U.S. PATENT DOCUMENTS

| | | | |
|---|---|---|---|
| 2,101,549 | 4/1935 | Lamb | 250/20 |
| 4,236,254 | 11/1980 | Augustin et al. | 455/223 |
| 4,479,251 | 10/1984 | Dawson | 455/223 |
| 4,521,917 | 6/1985 | Holt Jr. | 455/223 |
| 4,637,066 | 1/1987 | Kennedy et al. | 455/223 |
| 4,688,265 | 8/1987 | Chemelewski | 455/223 |
| 4,703,507 | 10/1987 | Holden | 455/225 |
| 4,704,736 | 11/1987 | Kasser | 455/223 |

FOREIGN PATENT DOCUMENTS 2646104  4/1978  Fed. Rep. of Germany ...... 455/223

OTHER PUBLICATIONS

James J. Lamb, "A Noise-Silencing I.F. Circuit for Superhet Receivers", OST-Feb. 1936, pp. 11-15, 38-39, 90-93, 106-112.

James J. Lamb, "More Developments in the Noise-Silencing I.F. Circuit", QST—Apr. 1936, pp. 16-19, 78-86.

J. D. Martin, "Audio Clipping and Blanking in an AM Receiver", IEEE Transactions on Vehicular Technology, vol. VT-29, No. 2, May 1980, pp. 298-304.

Primary Examiner—Robert L. Griffin
Assistant Examiner—Curtis Kuntz

[57] ABSTRACT

To a standard AM radio receiver there is connected an impulse-noise suppression system comprising a preliminary blanking gate adapted for connecting to and for interrupting the AM-modulated signal path at the input of the IF section, and an audio blanking gate adapted for interrupting the audio circuit. Both blanking circuits detect impulse noise at the RF amplifier and with appropriate delays blank both points. Audio blanking masks the audio disturbance caused by the blanking in the AM-modulated-signal path. Audio blanking time is preferably from 2 to 3 times the duration of the blanking of the AM-modulated-signal path and is thus kept very short causing a minimum interruption of the wanted audio signal. Associated with the audio-signal-path blanking circuit is a sample and hold circuit for smoothing the blanked audio signal and virtually eliminating an audio disturbance or noise that is otherwise generated by the audio blanking circuit itself.

8 Claims, 3 Drawing Sheets

TIME (MICROSECONDS)

NOISE BLANKING SYSTEM FOR AN AM RADIO RECEIVER

BACKGROUND OF THE INVENTION

This invention relates to AM radio receivers having a noise blanking circuit and more particularly to such a receiver wherein the blanking circuit responds to a noise spike by blanking both the modulated-AM-signal path and the audio-signal path.

This invention relates to all kinds of AM radio receivers and the term "modulated-AM-signal path" is thus meant to include the signal path in the RF section of a tuned radio frequency (TRF) receiver as well as to the signal path through the tandem combination in a superheterodyne receiver of the RF, mixer and IF sections. Also, the term "blanking" as applied to a signal path is used broadly herein to mean blocking the signal flow along the signal path, such as by interrupting the signal path, shorting the signal path or removing the electrical energizing source from a stage through which the signal path is routed.

The suppression of impulse noise in AM receivers has been accomplished by clipping off any impulse at the antenna that is greater than the amplitude modulation at the moment. This and other clipping circuits represent the simplest and least expensive AM noise blankers. Such noise clipping circuits do not eliminate the noise but just reduce its amplitude.

Another noise blanking system senses the noise in the RF or IF sections of a superheterodyne receiver and blanks the audio signal path. This system must employ a long blanking time that results in a thump sound from the receiver. This disadvantage is explained by the fact that nothing is done to protect the receiver RF and IF sections from overload and the pulse is stretched to a value equivalent to at least the period corresponding to the entire selectivity (bandwidth) of the receiver. As the noise impulse energy rises, the corresponding audio noise pulse is stretched more and more since the gain of the receiver will amplify the start and finish point of the initially stretched pulse in the IF filter farther and farther into IF amplifier saturation. This produces a long and variable length pulse. A low energy noise impulse is stretched to a minimum length, e.g. 150 microseconds, in the audio section determined by the IF passband, e.g. 452 KHz to 458 KHz. The audio noise pulse contains audio frequency components that are lower than the broadest audio frequency response that is determined by the IF passband, and thus at higher impulse energy levels, the audio noise pulse is even longer, e.g. 500 to 1000 microseconds. Also for high impulse noise the receiver AGC may be activated to the point that the desired signal is heavily attenuated.

A more complex but more effective and widely used noise blanking system in AM radios is one that senses the impulse noise in an early portion of the IF section of the receiver and blanks the signal path downstream at a point in the AM-modulated-signal path, e.g. in a later portion of the RF section of the radio. Such a system was first described by James J. Lamb in the paper entitled "A Noise Silencing I.F. Circuit for Superhet Receivers", QST, February 1936, pp. 11, 12, 13, 14, 38, 90, 92, 106, 108, 110 and 112, and in his patent U.S. Pat. No. 2,101,549 issued Dec. 7, 1937. Subsequently, a modified Lamb noise suppressor system senses the presence of a noise pulse in the RF section and blanks downstream in either the RF section of IF sections of the receiver. However, as is further explained below, this kind of noise suppressor system operative in the RF or IF sections of the receiver results in a bop sound at each incidence of a noise impulse. That sound is more pronounced in high fidelity AM radio receivers such as the recently introduced stereo AM receivers wherein such disturbances are even more objectionable.

It is therefore an object of the present invention to provide a noise blanking system that upon being connected to an AM radio receiver more effectively suppresses impulse noise therein.

SUMMARY OF THE INVENTION

To a conventional AM radio receiver there is added a preliminary blanking means and an audio blanking means. In one particular aspect of the invention, the preliminary blanking means is connected to a detection point and to another point, the RF blanking point that is either coincident with or downstream of the detection point in the AM-modulated-signal path of the receiver. In another particular aspect of the invention, the preliminary blanking means includes a separate antenna for detecting the noise impulse. the preliminary blanking means is for generating a preliminary blanking pulse of predetermined fixed duration and for blanking the signal in the AM-modulated-signal path for said duration at the RF blanking point when a noise pulse is detected.

The audio blanking means is connected to a sensing point in the AM-modulated-signal path, that may be the above-mentioned detection point, or to the separate antenna, and is connected in the audio-signal path of the receiver for interrupting the audio-signal path for a period of from 2 to 5 times that of the preliminary blanking pulse duration. A sample and hold circuit means connected downstream of the audio blanking point of the audio-signal path is for sampling and holding the voltage constant there during the above-noted period of audio-signal-path interruption. This has the effect of smoothing the interrupted portion of the audio signal.

In a conventional radio receiver the audio bandwidth is limited and determined by the bandwidth of the radio-frequency selective circuits in the preceeding AM-modulated-circuit path. And in that path the most narrow and controlling bandwidth is commonly found in the IF section. Thus the least width of a noise pulse that occurs in the audio section in response to an impulse of amplitude modulation at the input of the IF section is inversely related to the bandwidth of the IF section.

However, this invention recognized that the width of a disturbance that occurs in the audio section in response to RF blanking and the resulting square pulse of amplitude modulation in the input of the IF section will always be twice or a little more than twice the width of the square pulse of amplitude modulation no matter what bandwidth the IF section may have. Therefore, the width of the audio blanking pulse is preferably made from 2 to 3 times larger than the width of the RF blanking pulse. If that audio blanking pulse is given the appropriate amount of delay, e.g. 10 sec, to register it with the audio disturbance from the RF blanking pulse, optimum noise suppression is achieved. Alternatively, if in the interest of simplicity no such delay in the audio blanking pulse is provided, then it may be necessary to increase the audio blanking pulse width to from 3 to 5 times the width of the RF blanking pulse. Thus the RF (or IF) blanking removes electromagnetic impulses whether from meteorological sources, from fluorescent lamps, light dimmers with silicon controlled rectifiers, motor commutation systems, or relays but produces a square hole in the RF or IF carrier (a time of zero modulation) that produces a disturbance itself in the audio section. The audio blanking, and filling by a sample and hold circuit, renders that disturbance essentially imperceptible by a radio listener.

The noise suppression system of this invention is especially compatible with high performance AM radios, such as the recently introduced AM stereo radios, that are sold at premium prices. In this case each audio path will have an audio-signal path blanking gate. Other such applications include AM radios for navigation and military equipment where high quality performance also has a particularly high value.

DESCRIPTION OF THE PREFERRED EMBODIMENTS

Figure 1:
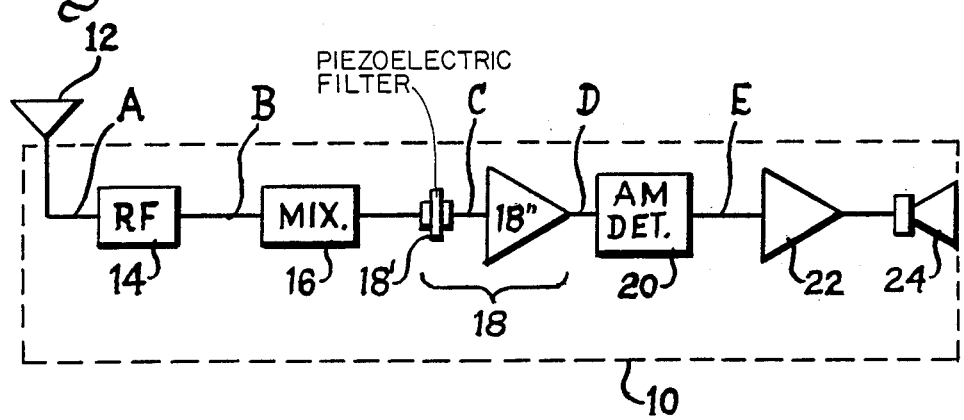
FIG. 1 shows an elementary block diagram of a superheterodyne radio receiver of the prior art without an impulse suppression circuit.

Referring to FIG. 1, the radio receiver 10 includes an RF section 14 with an input connected to an antenna 12, a local oscillator mixer section 16 and an IF section 18. Thus in the receiver 10, the main AM-modulated-signal path passes through the tandem connected RF, mixer and IF sections to the AM detector 20. The main audio signal path of the receiver 10 subsequently passes through the audio amplifier 22 to the speaker 24.

Figure 2A:
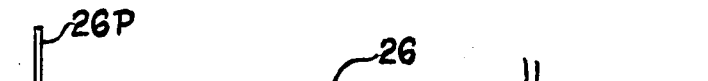
FIGS. 2B, 2C, 2D and 2E show the waveforms of signals appearing at the four consecutive points B, C, D and E respectively in the signal path of the radio receiver of FIG. 1 in response to an impulse of noise illustrated in FIG. 2A. These waveforms have the same time scale.
Figure 2B:
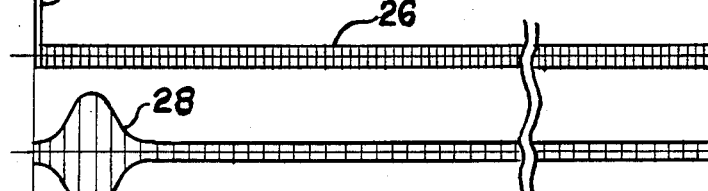

A noise impulse 26p, that may be superimposed on an RF carrier is illustrated by waveform 26 in FIG. 2A. Impulse 26p appears at the input of the receiver 10, at point A in FIG. 1. In response, a "pulse" of substantial width as illustrated by the waveform 28 in FIG. 2B appears at point B at the output of the tuned RF section 14 having a band width of about 10 KHz. This "pulse" 28 at point B is a transient oscillation of the frequency to which the RF section 14 is tuned. In conventional AM broadcast receivers tunable over the band of 0.5 to 1.5 Khz, pulse 28 typically lasts for about 50 microseconds, a quantity that is inversely related to the bandpass of the RF section 14. Also its beginning is slightly delayed from the impulse 26. The IF section 18 of the receiver 10 has a piezoelectric filter 18' that resonates at the IF frequency and establishes an IF section bandpass of about 12 KHz. IF section 18 further includes an amplifier 18''.

Figure 2C:
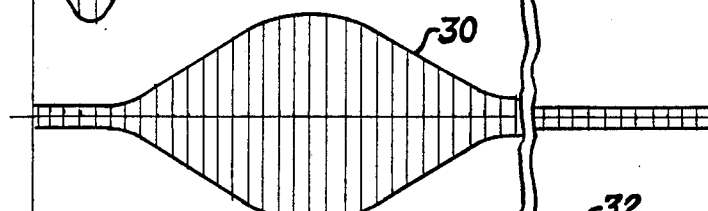

In passing through the IF filter 18', the transient becomes even wider owing to the narrow IF bandpass. In fact, from point B to point C, the pulse id transformed in three respects. The RF pulse 26 is transformed to transient pulse 28 that oscillates at the IF frequency after being heterodyned by the mixer 16. The filter 18' delays the start of this oscillation by about 50 microseconds and lengthens it to about 200 microseconds. The pulse at point C illustrated in FIG. 2C as waveform 30 is a transient oscillation at the IF frequency, e.g. 455 KHz. All pulse widths are measured at a level of 10% of peak pulse amplitude. Because of the IF-bandpass-related exponential decay characteristic at the trailing edge of the pulse 30 at point C and because of the early saturation of the high gain amplifier 18'', the pulse width of the amplified and clipped pulse 32 at point D at the output of the amplifier 18'' is much greater yet. The AM detector 20 preserves only the envelope of pulse 32 to produce at point E an "audio" pulse 34 of the same width as is pulse 32.

For noise pulses of increasing energy, the amplitudes of pulses 28 and 30 increase proportionally while their pulse widths remain about constant. However, for noise pulses of increasing energy IF amplifier 18'' soon saturates and the pulses 32 and 34 have no greater amplitudes but their pulse widths increase, e.g. to as much as 800 and 1000 microseconds for a typical AM broadcast band receiver.

Figure 3:
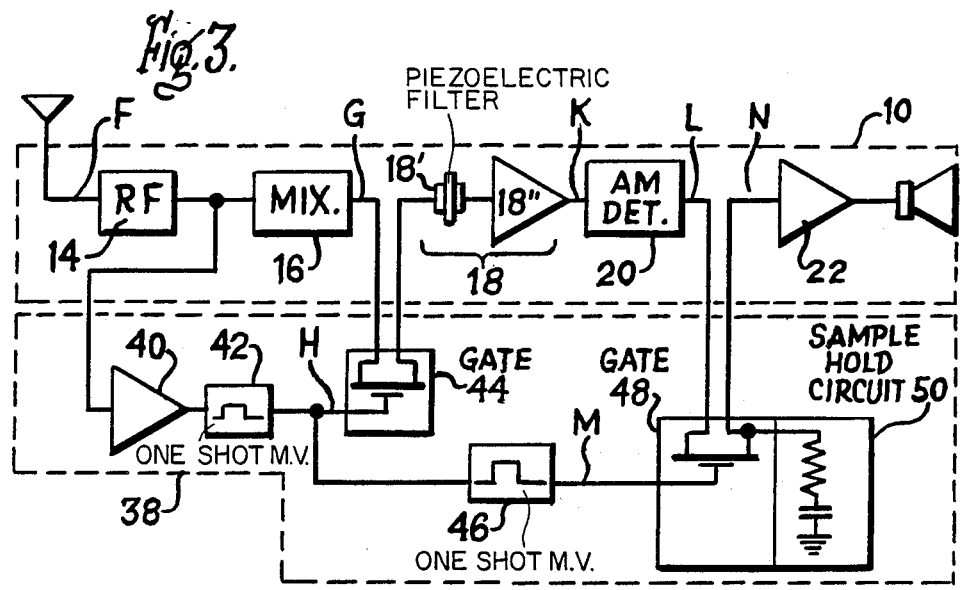
FIG. 3 shows a block diagram of a noise suppression circuit according to a first preferred embodiment of this invention connected to an AM superheterodyne radio receiver

Referring to FIG. 3, a noise suppression circuit 38 of this invention is connected to the radio receiver 10. The noise suppression circuit 38 has an amplifier 40 followed by a one shot multivibrator 42 and an electrically activatable gate 44. These three elements constitute a preliminary noise suppression or blanking means that is operative in the AM-modulated signal path. The noise suppression circuit 38 additionally includes another one shot multivibrator 46, another electrically activatable gate 48 that momentarily blanks for a period determined by the blanking control pulse from block 46, and a sample and hold circuit 50. These later three circuits are the key components of an audio noise blanking means having noise-blanking efficacy only in the audio signal path of the receiver 10.

Figure 4F:
FIGS. 4G, 4H, 4J, 4K, 4L, 4M and 4N show the waveforms of signals at circuit points F, G, H, J, K, L, M and N respectively in the block diagram of FIG. 1 in respnse to the superimposed AM carrier signal and noise impulse at the input of the receiver that is illustrated in FIG. 4F. The waveforms have the same time scale.
Figure 4G:
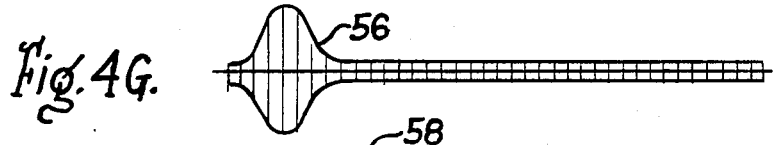
Figure 4H:
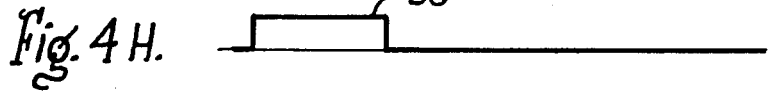

When the receiver is tuned to an RF carrier signal 52 and a noise impulse 54 is picked up by the antenna 12 as in FIG. 4F, an oscillating transient pulse 56 appears at the output of mixer section 16 in receiver 10 at point G. At the same time the amplifier 40 filters out the RF signal 52 and thus selectively amplifies the noise impluse 54. The amplified noise impulse triggers the one shot multivibrator 42 after a short delay (e.g. 10 microseconds) to produce at the output of the multivibrator 42 a first blanking gate control pulse 58 about 70 microseconds wide that is coincident in time and a little larger in width than that of the pulse 56. Control pulse 58 causes the MOS gate 44 to open and thus momentarily blank the AM-modulated signal path for the period when the control pulse is on. By this blanking means the noise pulse is prevented from getting through.

Figure 4J:
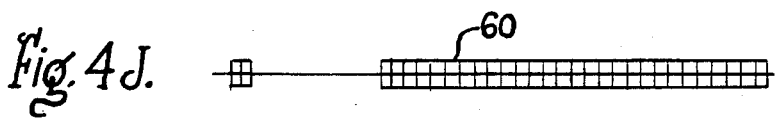
Figure 4K:
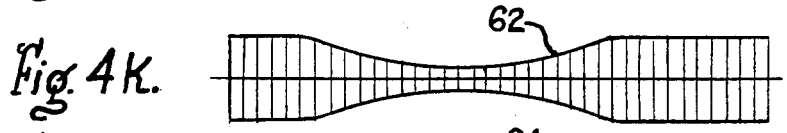
Figure 4L:
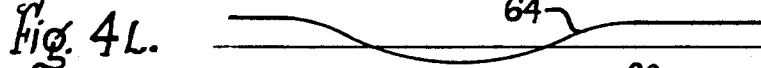
Figure 4M:
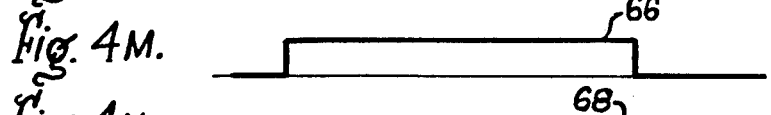

However, during the blanking of pulse 56, the carrier as well as the noise is prevented from getting through and at point J in the receiver the waveform 60 consists of the IF carrier with a hole in it, as in FIG. 4J. This hole represents a period of zero AM modulation and after transmission through the narrow bandpass (e.g. 6 KHz) of the IF section 18 appears at point K as the IF signal with waveform 62 as shown in FIG. 4K. The envelope of pulse 62 appears downstream of the detector 20 at point L in the signal path as the "audio" signal having a waveform 64 shown in FIG. 4L.

Figure 4N:
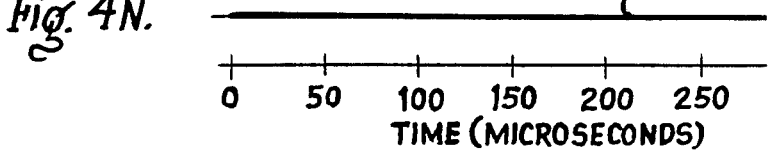

The one shot multivibrator 46 produces an output blanking pulse 66 that is delayed about 45 microseconds from the noise impulse 54 and that has a width of about 190 microseconds. The audio blanking pulse 64 turns off the gate 48 opening the audio signal path beyond point L and turns on the sample-and-hold circuit 50 to clamp the voltage at point N for the duration of pulse 66 at the level it had been at the time of initiation of pulse 66. As a result, the noise impulse causes essentially no disturbance in the audio signal at point N that is represented in FIG. 4N as a straight line waveform 68.

Figure 2D:
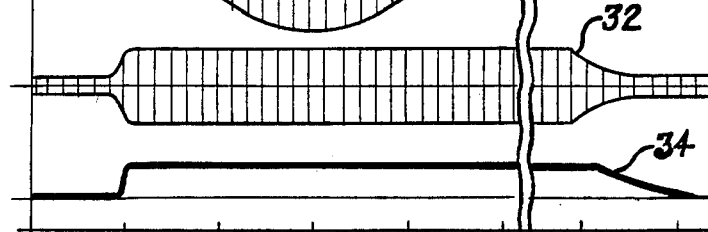
Figure 2E:
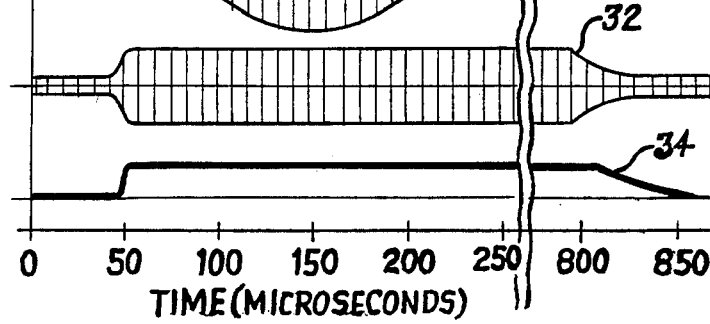

Referring again to the foregoing discussion of a standard superheterodyne receiver 10 without noise suppression means as in FIG. 1, the width of a pulse appearing at the output of the bandwidth determining portion 18″ of the IF section 18 in response to an impulse of infinitesimal width at the input of the IF section 18 will always be about equal to ½BW where BW is the IF bandwidth. For example, that IF output pulse at points C will be the reciprocal of the IF bandwidth halved, 170 microseconds, plus the amount of the input pulse width, 50 microseconds, totalling 220 microseconds. Actually in this case it was closer to 200 microseconds but this rule of thumb is always useful and points up the fact that the width of pulses along the signal path in the receiver that stem from noise impulses are a known function of the bandwidths of the tandem connected receiver sections through which the AM modulated signals are processed, except when any section is allowed to saturate, e.g. as in FIG. 2D. That causes signal clipping which can expand the pulse width many times due to the amplification and exponential tailing off of the preliminary-blanking disturbance.

The preliminary blanking system represented in FIG. 3 by circuit blocks 40, 42 and 44 prevents saturation and produces a short 150 microseconds wide pulse of AM modulation at the output of the IF section, point K, as shown in FIG. 4K. The width of this IF output "noise pulse" is not dependent upon the bandwidth of the IF section. Its width is basically only dependent upon the duration of the AM-modulated-signal path blanking pulse (determined by one shot multivibrator 42), namely about twice that duration. This is the case because the IF output disturbance has a falling portion initiated at the delayed onset of the RF blanking pulse and symmetrically therewith a rising portion initiated at the delayed termination of the RF blanking pulse.

Figure 5:
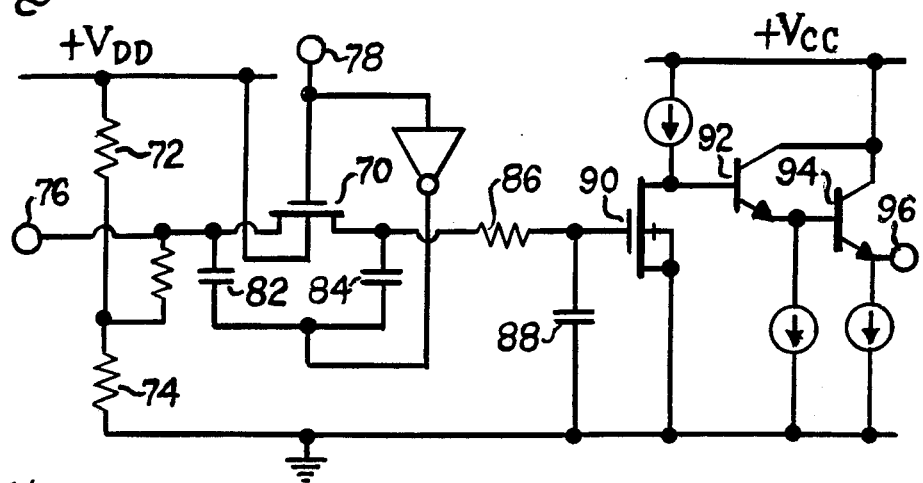
FIG. 5 shows a circuit diagram of an audio blanking gate with a sample and hold circuit for use in a noise suppression system of this invention.

A preferred MOS audio blanking gate circuit and a preferred MOS-bipolar sample-and-hold circuit are shown merged in FIG. 5. The MOS gate transistor 70 is a P-channel depletion device having a source connected to a biasing voltage divider of resistors 72 and 74 and to an input terminal 76 corresponding to input terminal 76 in FIG. 3. The gate of transistor 70 is connected to control input terminal 78 and a high (positive) signal here turns off transistor 70 whereas a low signal here turns on transistor 70. Capacitors 82 and 84 each have a value of 0.1 picofarads and serve to "compensate" and thus cancel the rise and fall portions of the audio blanking pulse that tend to couple into the input of audio amplifier 22. The drain of gate transistor 70 is connected to the network comprised of resistor 86 (e.g. 100K ohms) and capacitor 88 (e.g. 10 picofarads) that are connected at the gate of the N- channel transistor 90. Transistor 90 serves as a high-input-impedance linear buffer amplifier with an output connected to the Darlington connected transistors 92 and 94.

When the gate transistor 70 is conducting as is the case when there is no impulse noise, transistor 90 and transistors 92 and 94 pass the audio signal from terminal 76 to output terminal 96 that is in turn connected to the input of the audio amplifier 22. But as soon as a noise impulse causes a positive pulse at control terminal 78, transistor 70 opens and the gate voltage at transistor 90 is held at the level last appearing at terminal 76. The audio signal at terminal 96 is "frozen" until the blanking pulse at control terminal 78 again connects the audio signal from the detector 20 to amplifier 22.

Figure 6:
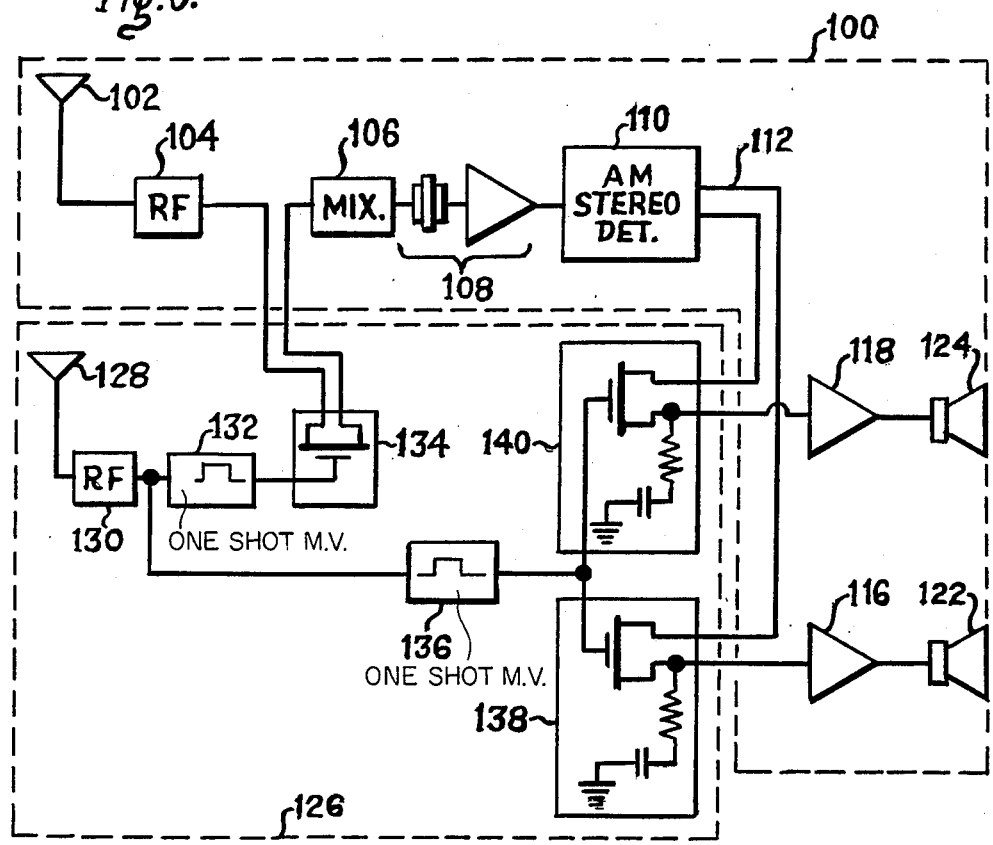
FIG. 6 shows a block diagram of a noise suppression circuit according to a second preferred ambodiment of this invention connected to a stereo AM radio receiver.

In the second preferred embodiment of FIG. 6, a stereo AM radio receiver 100 has an antenna 102, a tuned RF section 104, a mixer 106, an IF section 108, an AM stereo detector 110 with a "left" audio signal path 112 amd a "right" audio signal path 114, two audio amplifiers 116 and 118, and two speakers 122 and 124.

A noise blanking system 126 has its own antenna 128 and its own RF section 130. RF section 130 is a broadband RF amplifier. Large impulse noise triggers the one-shot multivibrator 132 that turns off the normally on MOS gate 134 effecting blanking of the very same noise impulse having been simultaneously picked up by the radio antenna 102.

Another one shot multivibrator 136 is also triggered by the same noise impulse but has a built-in delay of about 40 microseconds, a similar feature to that of the multivibrator 46 described above. Multivibrator 136 produces an audio gating pulse of about 190 microseconds. This turns off for 190 microseconds both the audio blanking gates 138 and 140, each of which includes a sample and hold circuit. In this way both left and right audio signals are blanked and smoothed during the audio signal disturbance created by the preliminary blanking of the impulse noise in the AM-modulated signal path.

Of course, the antenna 102 may or may not be a part of the receiver 100 in FIG. 6. Likewise, the antenna 128 may or may not be part of the noise blanking system 126. Also, the receiver 100 and the noise blanking system 126 may have their RF sections, 104 and 130 respectively, connected to the same antenna. Also, in principle the blanking MOS gate 134 may alternatively be connected between the antenna and the RF section 104 or anywhere else in the AM modulated signal path down to the IF filter. And even more generally, this blanking circuit may be employed in a T.R.F. receiver having no IF section (not shown).

What is claimed is:

1. A noise blanking system for suppressing impulse noise in an AM radio receiver comprising:
    a preliminary blanking means adapted for connection to a point in the AM-modulated-signal path of an AM radio receiver for sensing each occurrence of an ambient electromagnetic impulse of noise and for momentarily blanking the AM-modulated-signal path in said receiver; and
    an audio blanking means for sensing each occurrence of ambient electromagnetic impulse of noise, and adapted for connection to a point in one audio-signal path of the receiver for at said each occurrence interrupting said one audio-signal path for a period of from 2 to 5 times the duration of said momentarily blanking.

2. The noise blanking system of claim 1 wherein said audio blanking means is additionally for delaying, with respect to said each impulse occurrence, the start of said audio-signal-path-interrupting period by essentially the time corresponding to the inherent delay of a signal through the receiver just to the point of interrupting in said audio-signal path.

3. The noise blanking system of claim 2 wherein said audio-signal-path-interrupting period is no longer than 250 microseconds.

4. The noise blanking system of claim 1 wherein said audio blanking means is additionally for sampling the audio signal voltage at said point of blanking in the audio signal path just prior to said interrupting period, and holding the interrupted downstream end of the audio-signal path at said voltage during said period.

5. The noise blanking system of claim 1 wherein said audio blanking means (a) is further adapted for connection to a point in a second audio-signal path of the receiver, and (b) is additionally for interrupting said second path for said period, so that said noise blanking system may be used to blank the two audio-signal paths in a stereo AM radio receiver.

6. A noise blanking system for suppressing impulse noise in an AM superheterodyne radio receiver comprising:
a preliminary blanking means for sensing each occurrence of an ambient electromagnetic impulse of noise, being adapted for connection to a point in the AM-modulated-signal path of a superheterodyne AM radio receiver for blanking at said each occurrence for a duration of up to 75 microseconds said AM-modulated-signal path at a point therein upstream of the IF-bandwidth-determining circuit; and
an audio blanking means for sensing said each occurrence of ambient impulse of noise, and adapted for connection to a point in the audio-signal path of said receiver and interrupting said audio-signal path for a period of from 2 to 4 times the duration of said preliminary blanking.

7. The noise blanking system of claim 6 wherein said blanking duration is about 75 microseconds and said audio-signal-path-interrupting period is between 150 and 250 microseconds.

8. A noise blanking system adapted for connection to a conventional AM radio receiver having an AM-modulated signal section through which an AM-modulated signal path is routed, and an Am detector and an audio section through which an audio signal path is routed comprising:
a preliminary blanking means adapted for connection to one point in said AM-modulated-signal path and having an output adapted for connection to a second point in said AM-modulated-signal path that is downstream from said one point for, when a noise pulse occurs at said one point, generating a preliminary blanking pulse of fixed duration and blanking said AM-modulated-signal path at said second point for the duration of said preliminary blanking-pulse so that static and other impulsive RF noise is suppressed; and
an audio blanking means adapted for connection to a sensing point in said AM-modulated-signal path and adapted for connection to a point in said audio-signal path of said receiver, for interrupting said audio-signal path for a period of from 2 to 5 times as great as said preliminary blanking-pulse duration.

* * * * *